(12) United States Patent
Oshima

(10) Patent No.: US 8,710,565 B2
(45) Date of Patent: Apr. 29, 2014

(54) SEMICONDUCTOR DEVICE AND MANUFACTURING METHOD

(76) Inventor: Hiromitu Oshima, Tokyo (JP)

(*) Notice: Subject to any disclaimer, the term of this patent is extended or adjusted under 35 U.S.C. 154(b) by 6 days.

(21) Appl. No.: 13/463,289

(22) Filed: May 3, 2012

(65) Prior Publication Data

US 2013/0119546 A1    May 16, 2013

Related U.S. Application Data

(62) Division of application No. 12/824,381, filed on Jun. 28, 2010, now abandoned.

(30) Foreign Application Priority Data

Jun. 29, 2009   (JP) .................................. 2009-153637

(51) Int. Cl.
    *H01L 27/108* (2006.01)
(52) U.S. Cl.
    USPC ........................................................ 257/296
(58) Field of Classification Search
    None
    See application file for complete search history.

(56) References Cited

U.S. PATENT DOCUMENTS

| | | | |
|---|---|---|---|
| 2001/0008288 A1* | 7/2001 | Kimura et al. | 257/296 |
| 2001/0028079 A1 | 10/2001 | Kuroda | |
| 2005/0098823 A1 | 5/2005 | Adachi et al. | |
| 2011/0095348 A1* | 4/2011 | Chakihara et al. | 257/298 |

FOREIGN PATENT DOCUMENTS

| | | |
|---|---|---|
| JP | 10-223897 | 8/1998 |
| JP | 2000-036573 | 2/2000 |
| JP | 2001-223155 | 8/2001 |
| JP | 2003-163265 | 6/2003 |
| JP | 2004-247723 | 9/2004 |
| JP | 2005-094044 | 4/2005 |
| JP | 2005-109236 | 4/2005 |

* cited by examiner

*Primary Examiner* — Charles Garber
*Assistant Examiner* — Andre' C Stevenson
(74) *Attorney, Agent, or Firm* — Young & Thompson

(57) ABSTRACT

The method of the present invention comprises forming a word line crossing with an active region on a semiconductor substrate; forming a diffusion layer region; forming a first insulating film as high as a bit line to be formed; etching the first insulating film, while using, as a mask, a pattern having a linear aperture extending to the active region on the first insulating film so as to form a groove pattern for exposing the surface of the semiconductor substrate; embedding a conductive film in the groove pattern; forming a mask pattern passing over a portion, in which a bit contact is formed, on the first insulating film; and removing the first insulating film and the conductive layer until the upper layer insulating film of the word line is exposed, while using the mask pattern as a mask so as to isolate a bit contact from another contact.

10 Claims, 21 Drawing Sheets

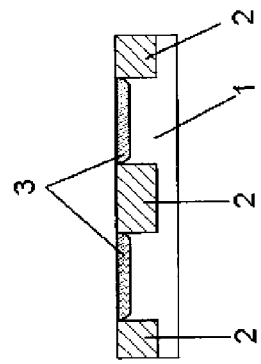
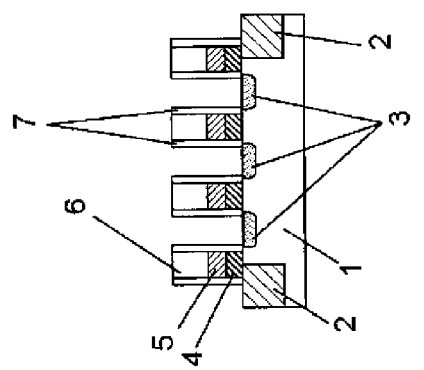
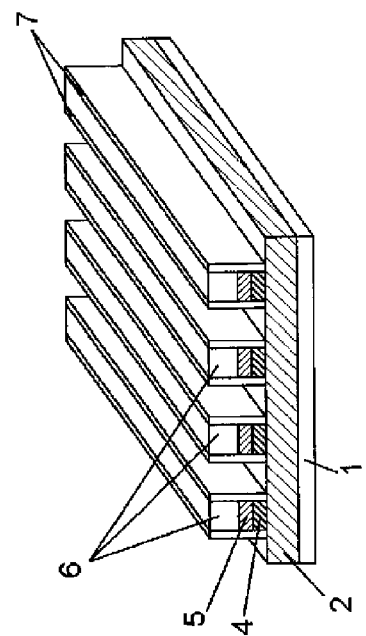
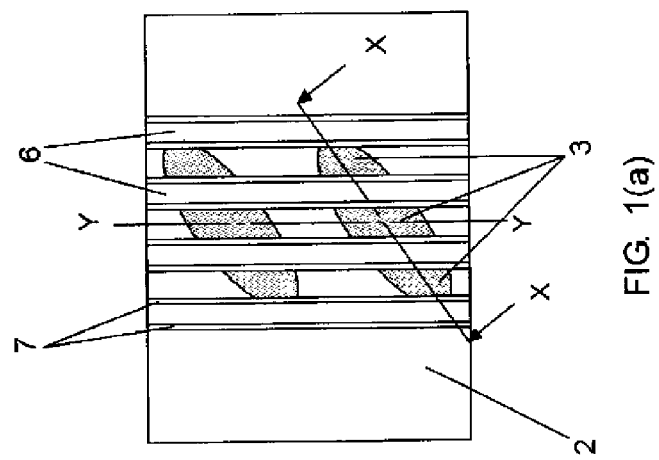
FIG. 1(a) (Related Art)
FIG. 1(b)
FIG. 1(c)
FIG. 1(d)

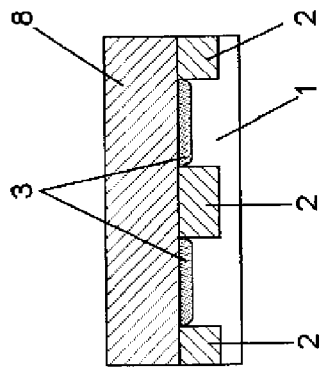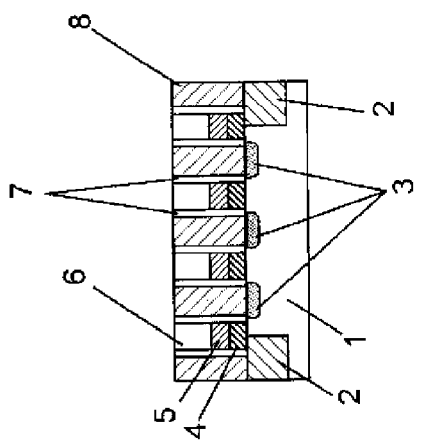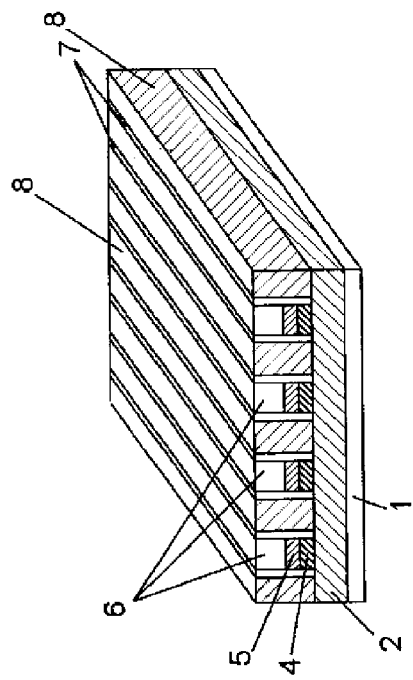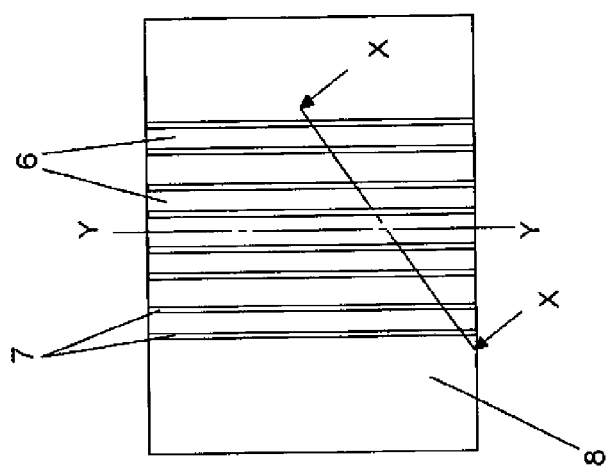
FIG. 2(a)
FIG. 2(b)
FIG. 2(c)
FIG. 2(d)
(Related Art)

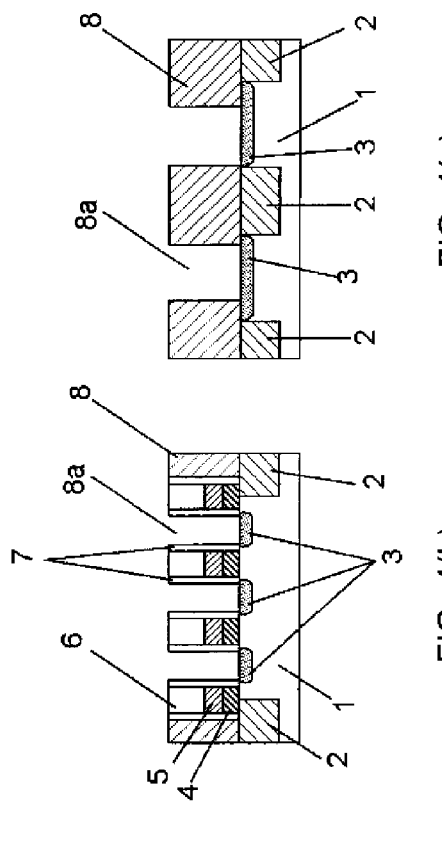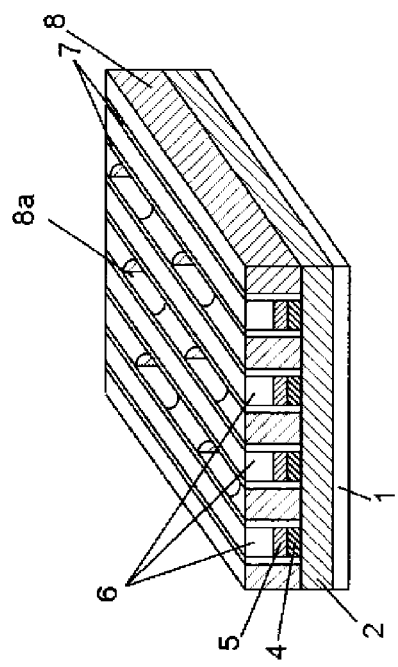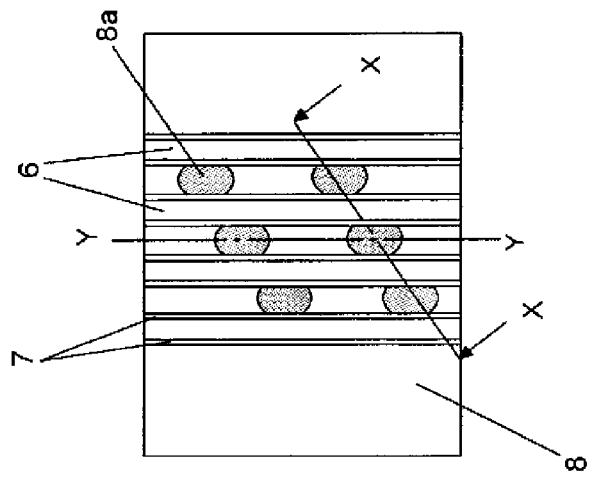
FIG. 4(a)
FIG. 4(b)
FIG. 4(c)
FIG. 4(d)
(Related Art)

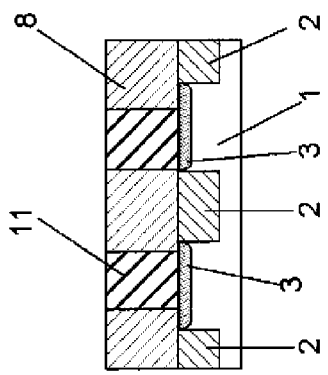
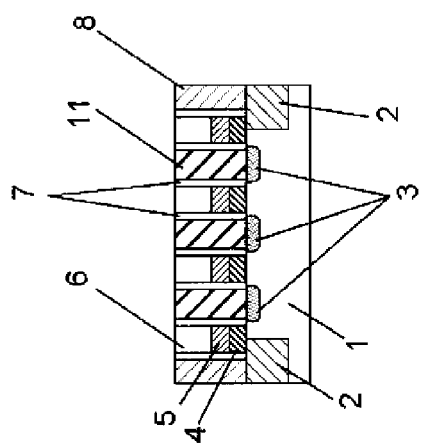
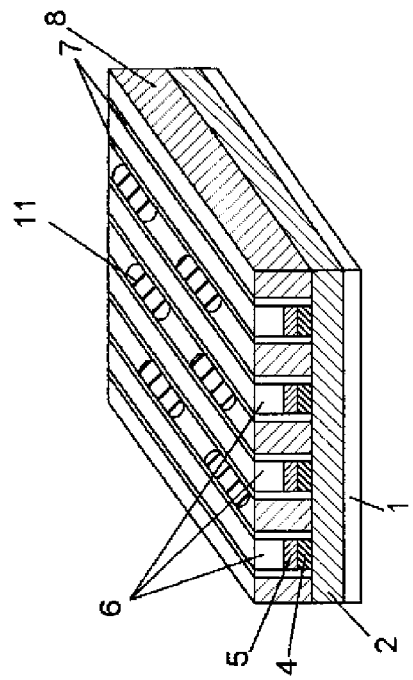
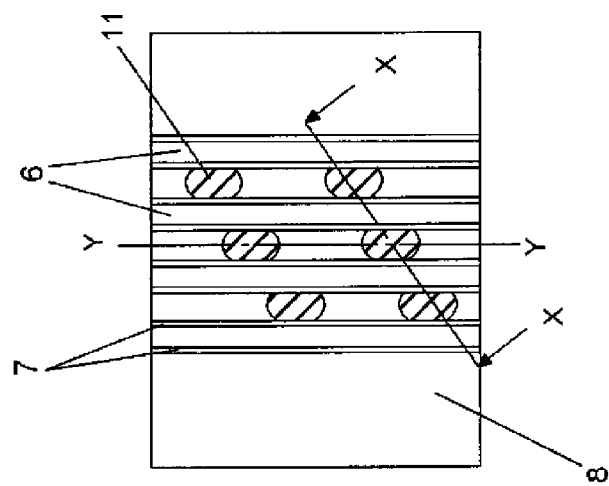
FIG. 5(a) (Related Art)
FIG. 5(b)
FIG. 5(c)
FIG. 5(d)

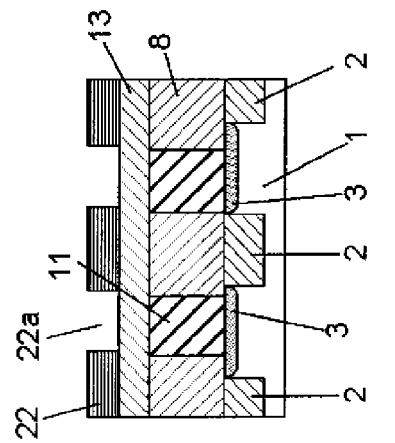
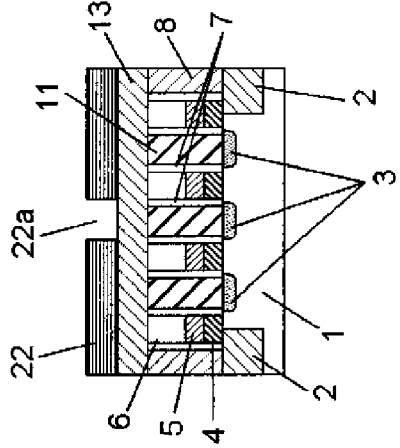
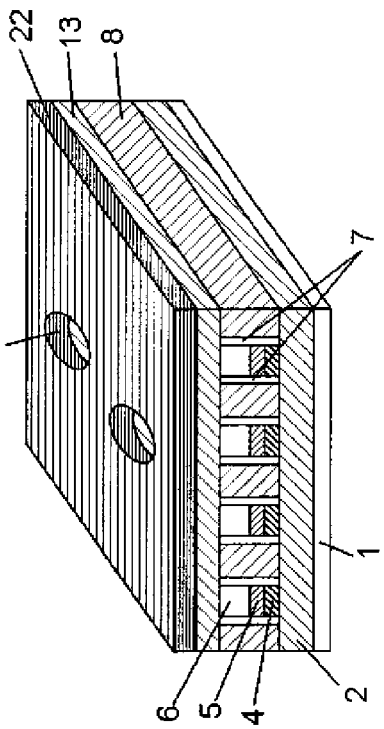
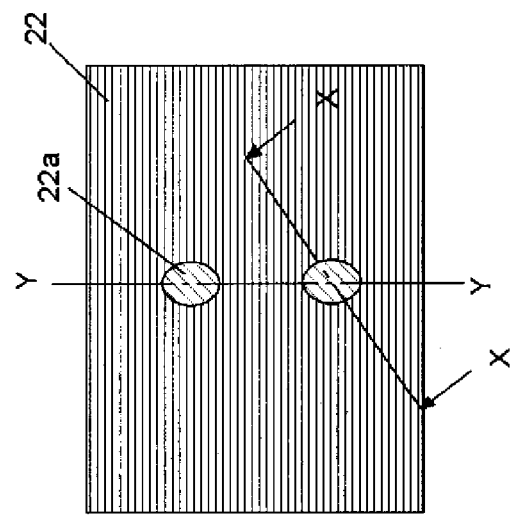
FIG. 6(a)
FIG. 6(b)
FIG. 6(c)
FIG. 6(d)
(Related Art)

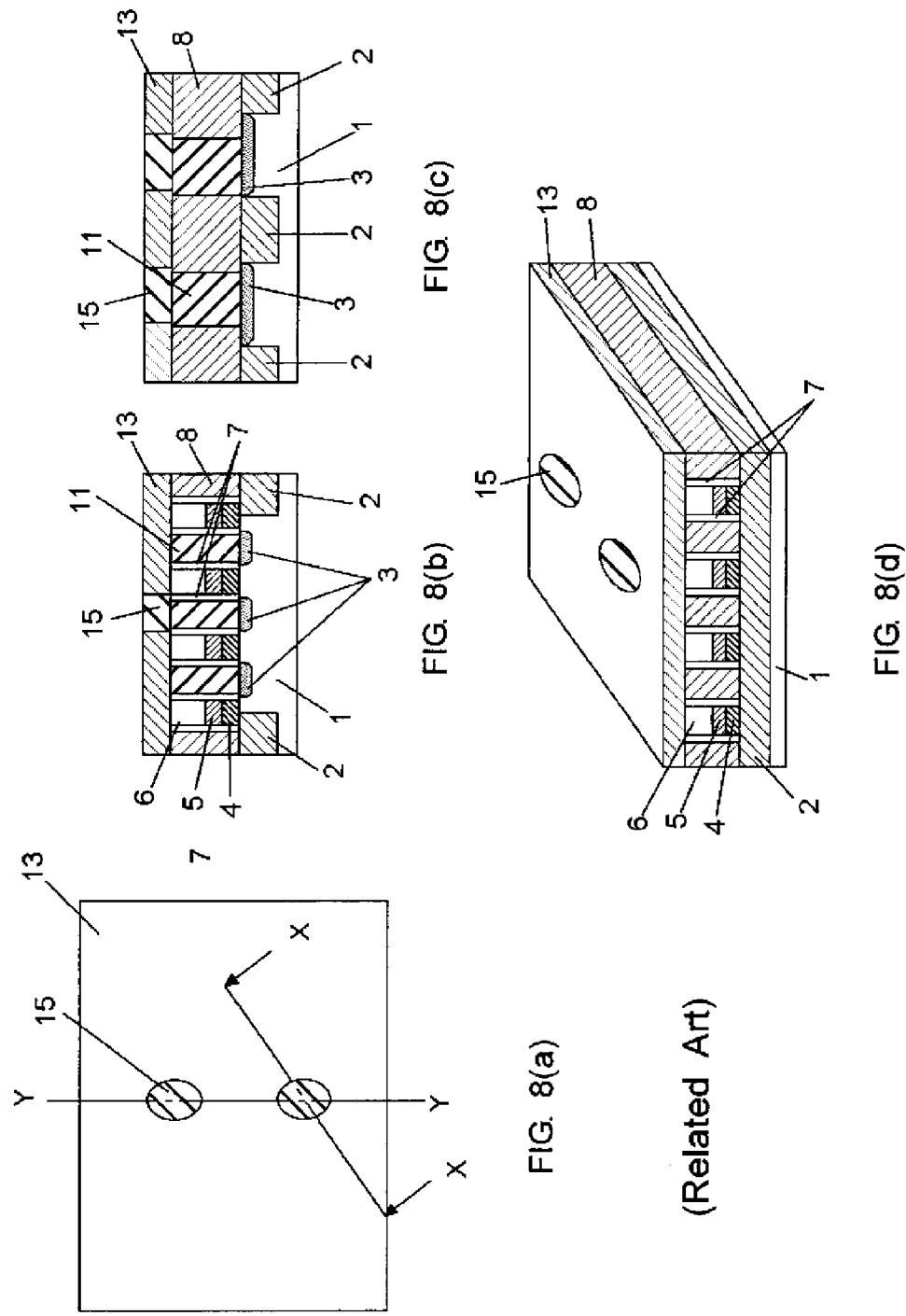

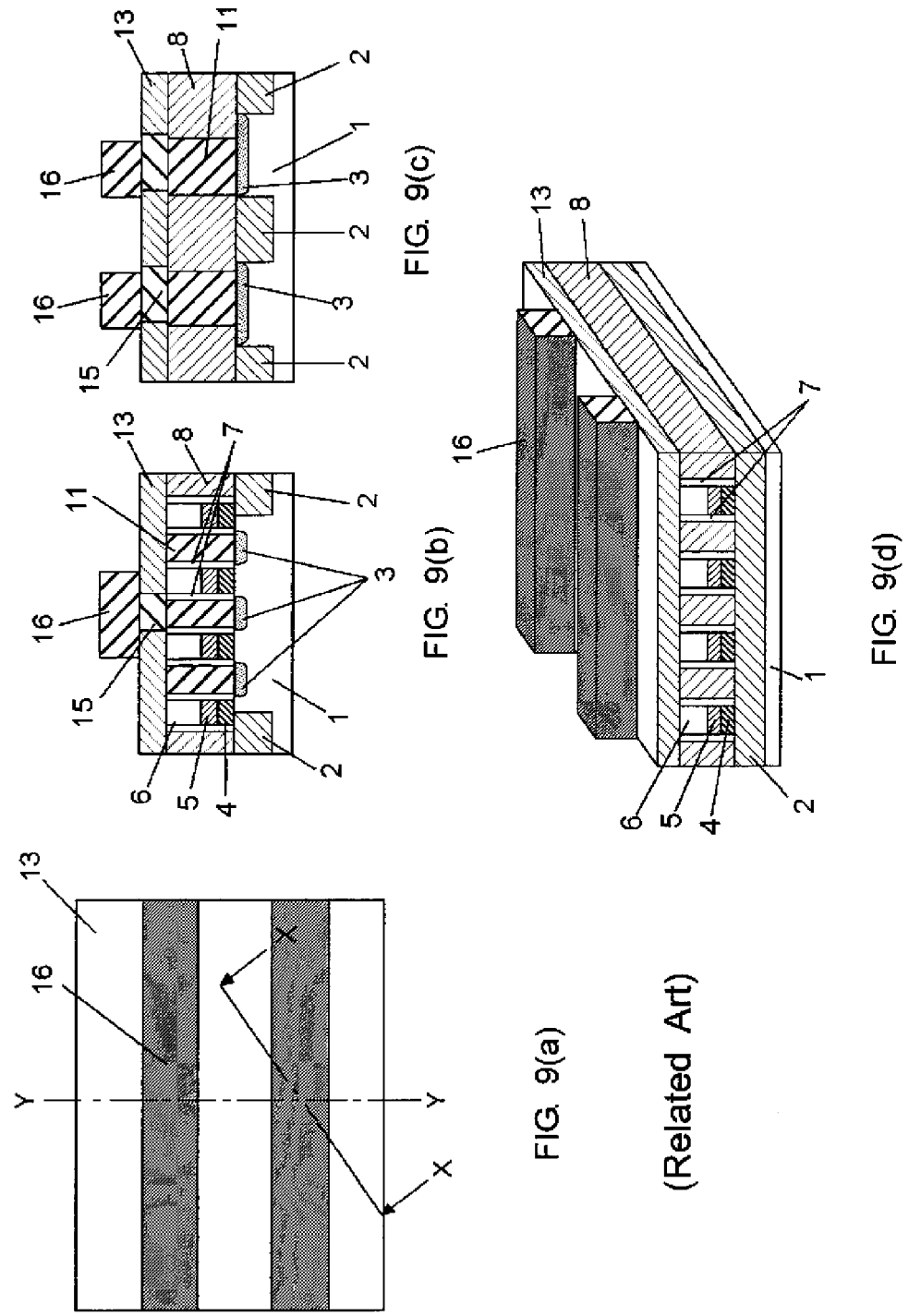

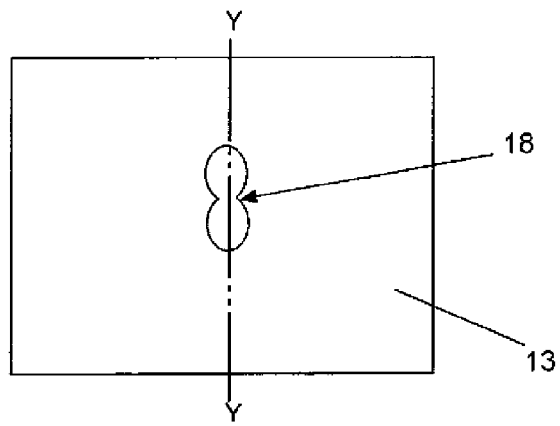
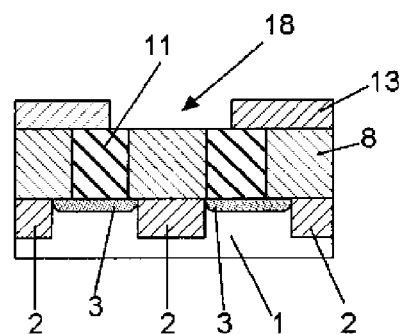
FIG. 10(a)　　　　　　　　　FIG. 10(b)
(Related Art)
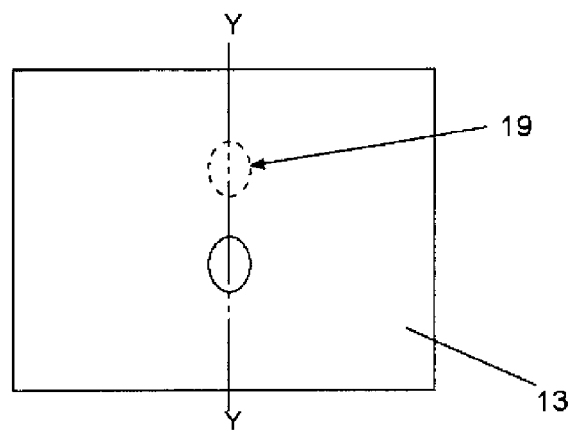
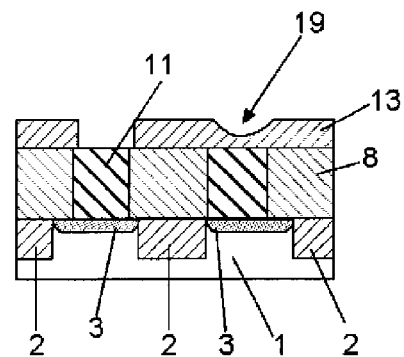
FIG. 10(c)　　　　　　　　　FIG. 10(d)
(Related Art)

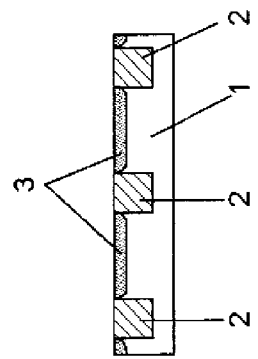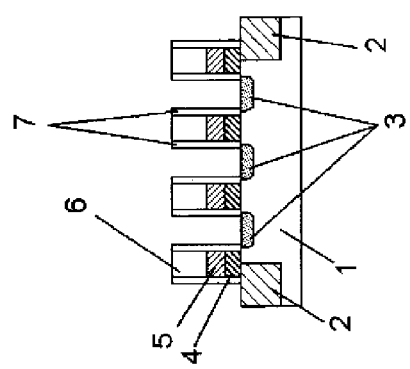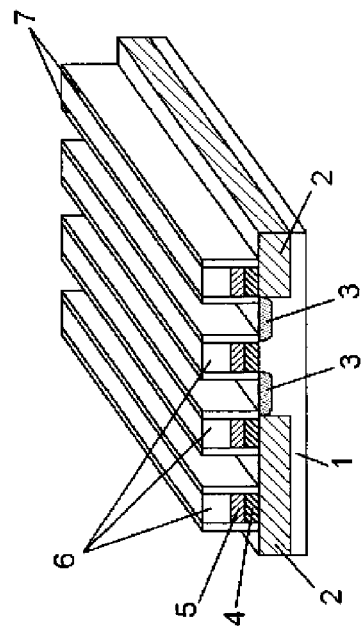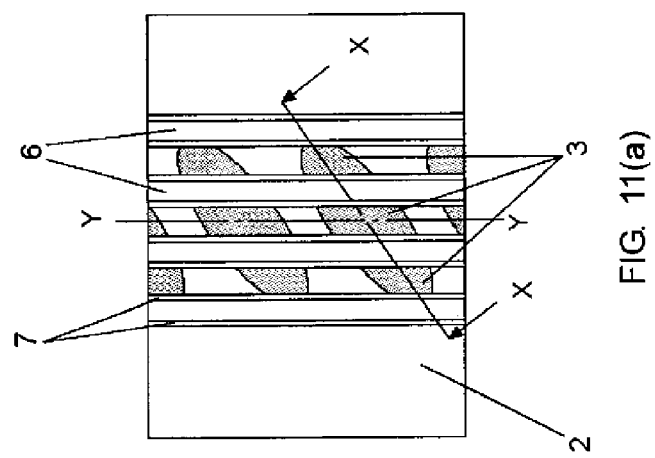

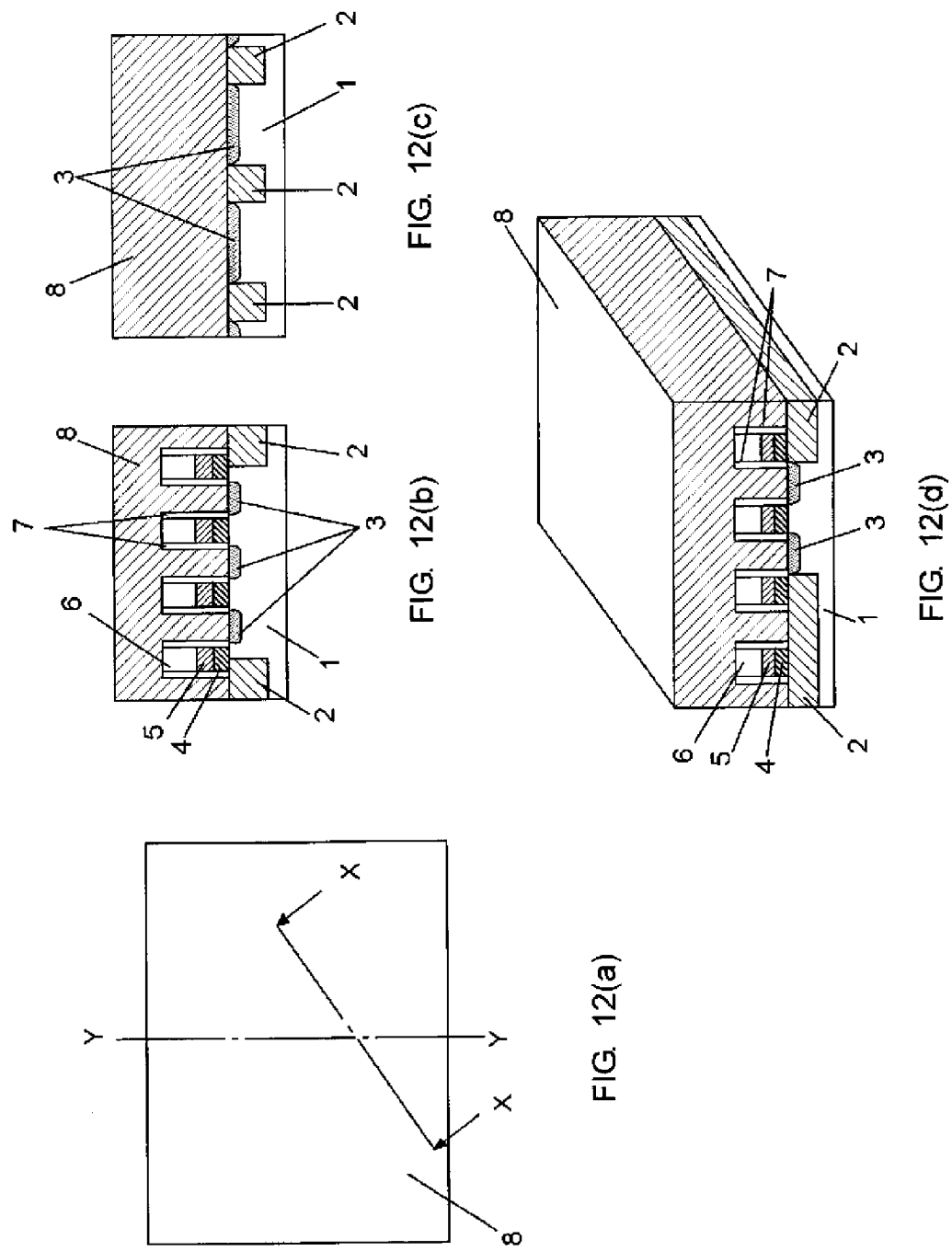

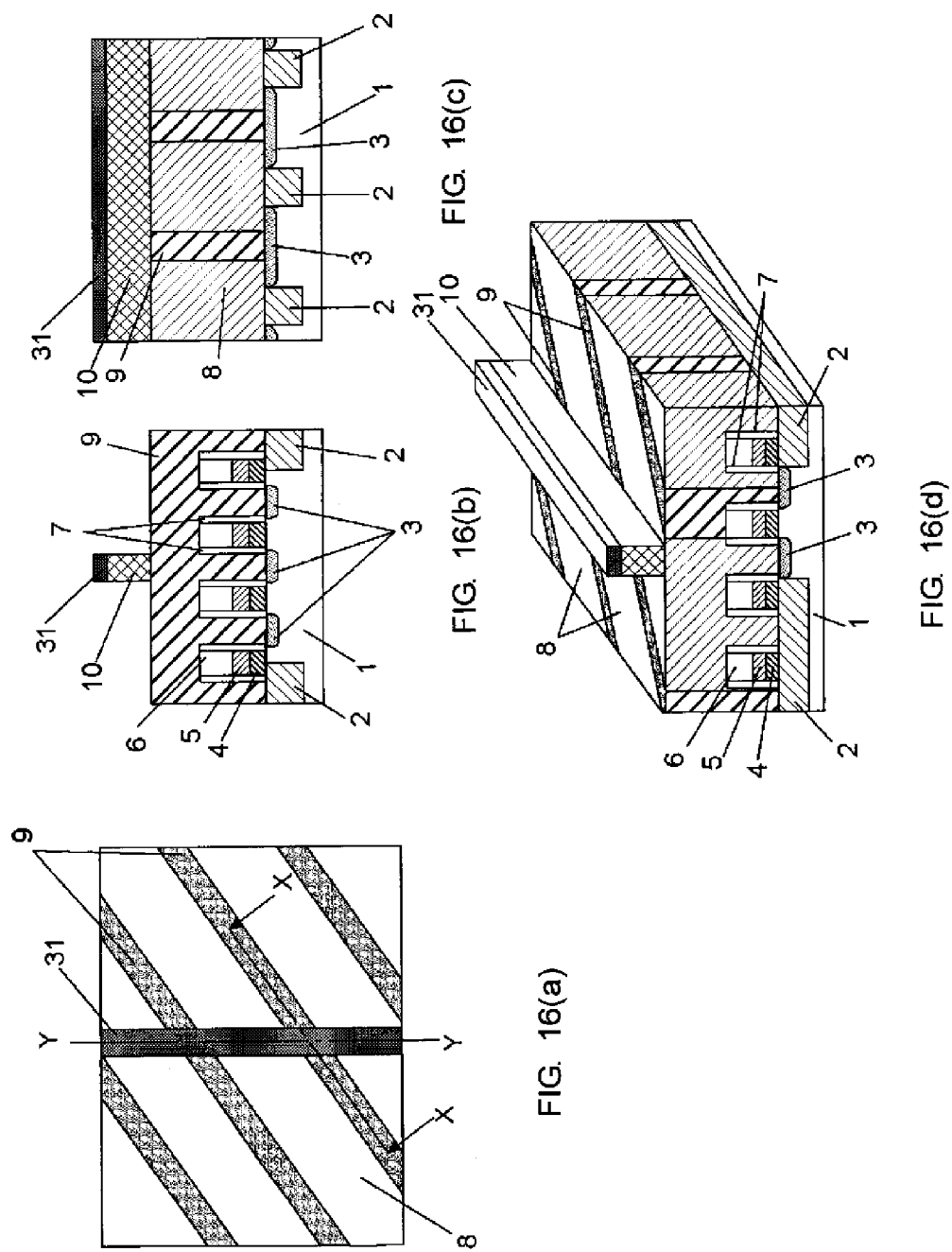

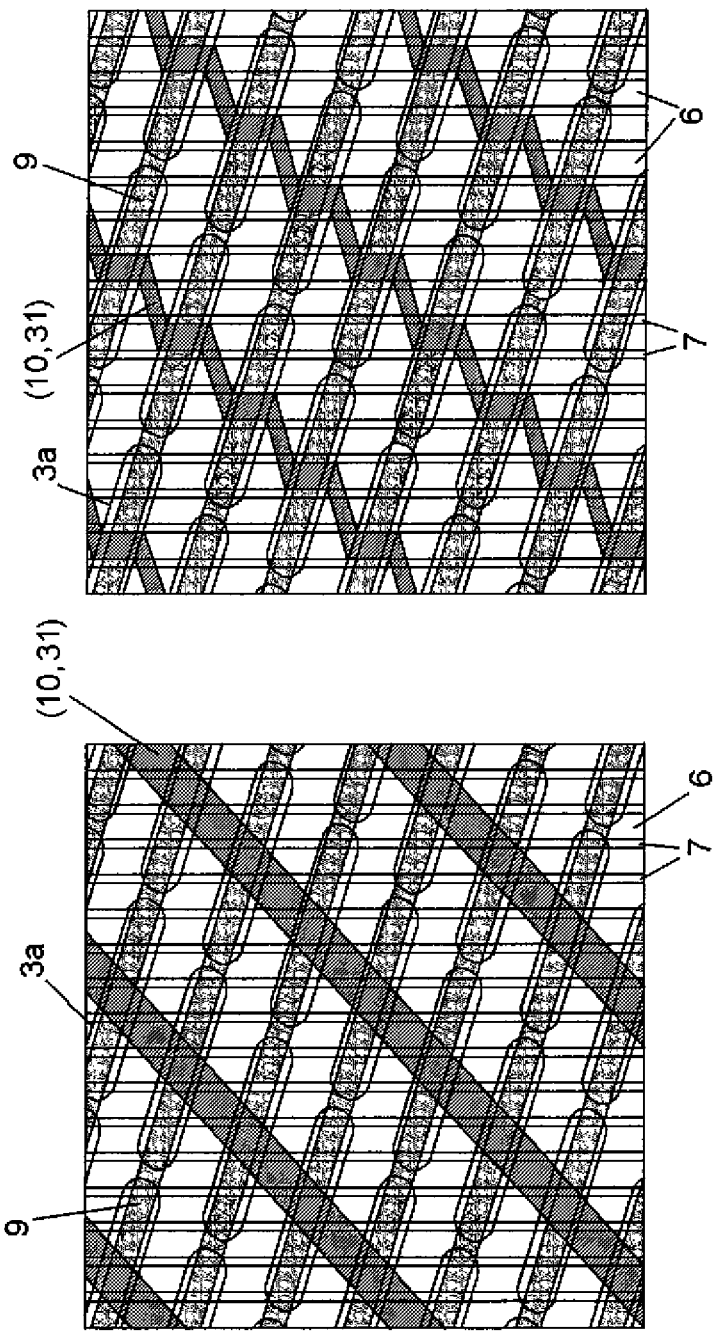

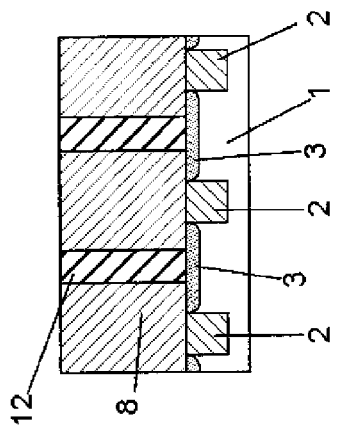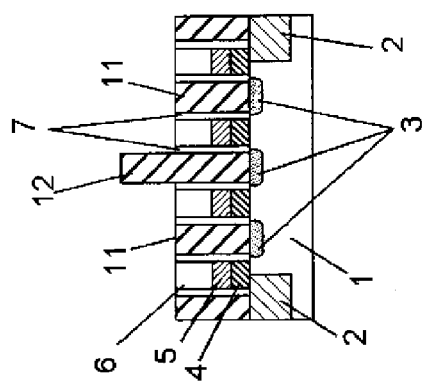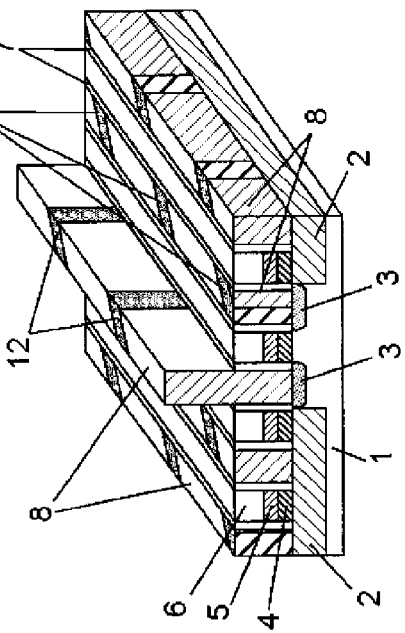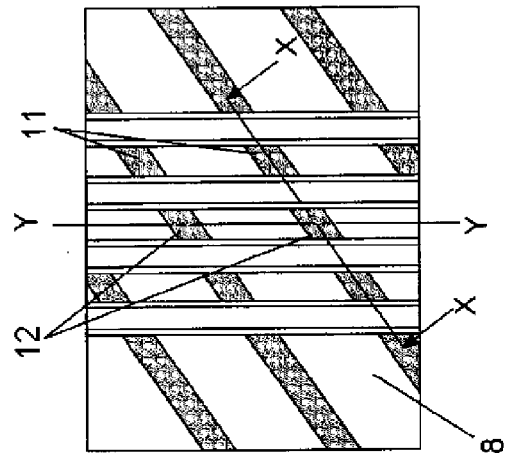
FIG. 18(a)
FIG. 18(b)
FIG. 18(c)
FIG. 18(d)

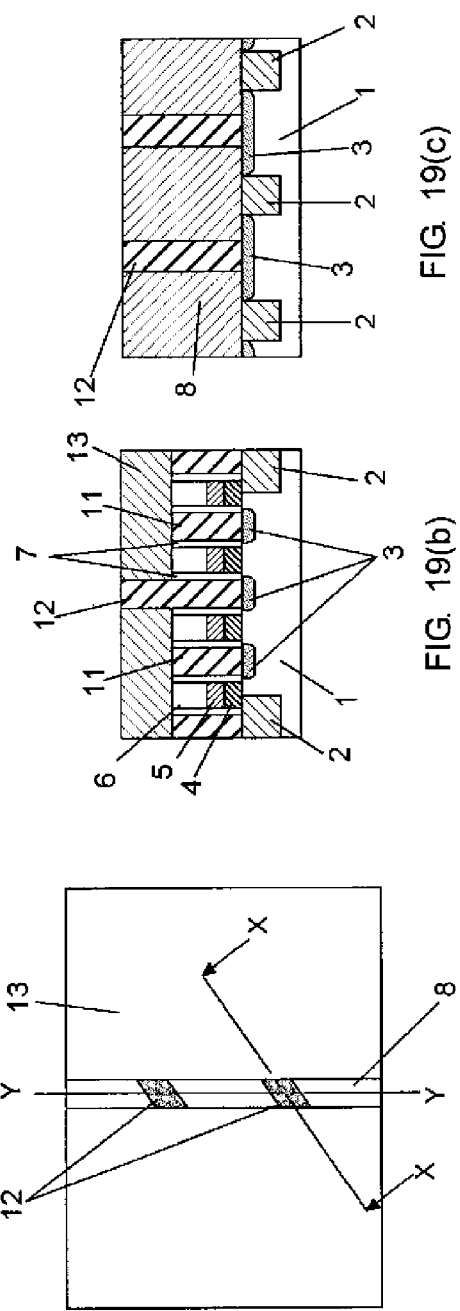
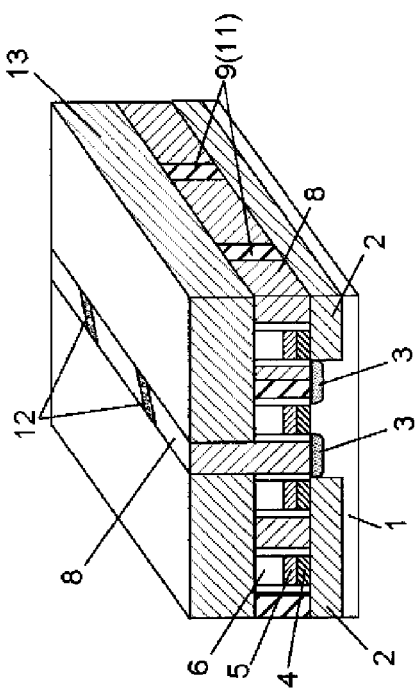

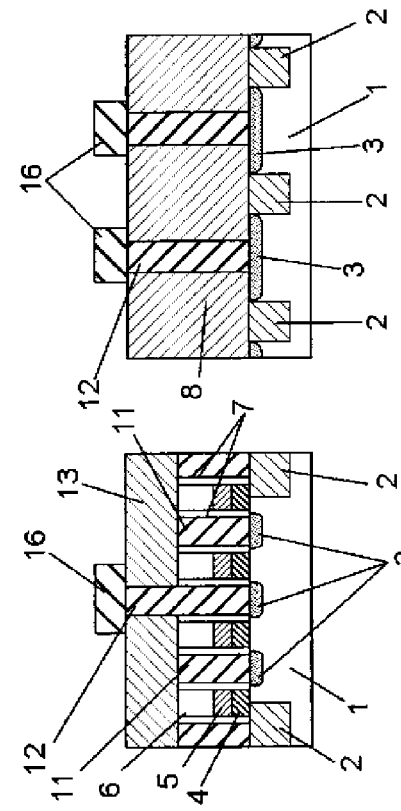
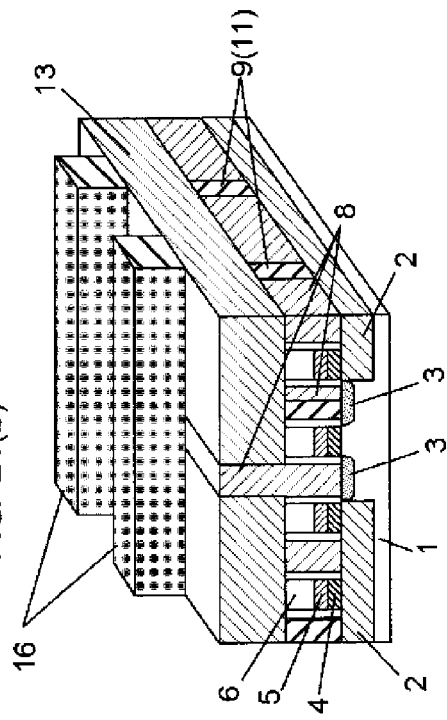
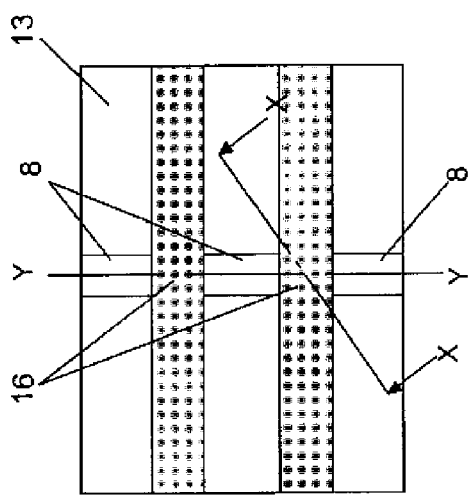
FIG. 21(c)
FIG. 21(b)
FIG. 21(d)
FIG. 21(a)

SEMICONDUCTOR DEVICE AND MANUFACTURING METHOD

CROSS REFERENCE TO RELATED APPLICATIONS

This application is a division of co-pending application Ser. No. 12/824,381 filed on Jun. 28, 2010, which claims foreign priority to Japanese application No. 2009-153637 filed on Jun. 29, 2009. The entire content of each of these applications is hereby expressly incorporated by reference.

BACKGROUND OF THE INVENTION

1. Field of the Invention

The present invention relates to a method of manufacturing a semiconductor device, in particular, to a method of forming a bit contact in a memory cell, etc., of a DRAM (Dynamic Random Access Memory).

2. Description of the Related Art

In a semiconductor integrated circuit device, wiring is being micro-miniaturized in order to improve characteristics and yields. In a process of manufacturing a micro-miniaturized semiconductor integrated circuit device, there is a problem since if design margin for a contact hole is determined in consideration of deviation of alignment with lower layer wiring, the deign dimension (=hole diameter+design margin) of the contact hole would be oversized. Alignment deviation is caused by deficiency of alignment performance of a reduced projection stepper used in photolithography. Moreover, alignment deviation makes scaling down, which is one of various dimension requirements (scaling•factor) for a semiconductor process, difficult. As such, it is said that alignment deviation is a factor, which affects limits of the lithography technology more than the resolution limit.

Recently, a self-alignment contact (SAC) process, whereby design margin for alignment is unnecessary on a photo mask, has been mostly used.

In general, a DRAM memory cell has the structure, in which two neighboring transistors share a bit contact diffusion layer, and both sides thereof have a capacitor contact diffusion layer so as to form one cell. FIGS. 1 to 9 show processes until formation of a bit line of a cell transistor having the so-called COB (Capacitor Over Bitline) structure, in which a capacitor structure is formed on a conventional bit line. In each of the drawings, (a) is a top view, (b) is an XX cross-sectional view, (c) is an YY cross-sectional view, and (d) is a perspective projected view. The drawings were prepared by the inventor to explain the background art of the present invention and do not describe conventional technology itself.

Firstly, as illustrated in FIG. 1, a diffusion region (3) to be a source•drain is formed in a silicon substrate (1) partitioned by an isolation region (2). As to a cell transistor, polysilicon (4), tungsten (5), and silicon nitride (6) are laminated on a gate insulating film (not illustrated) and patterned by lithography and dry etching. Furthermore, after a silicon nitride film is formed and etched back, a side wall (7) is formed on the side surface of the polysilicon (4) and the tungsten (5) so that a gate (word line) is completed.

Subsequently, as illustrated in FIG. 2, an interlayer insulating film (8) is embedded between the gate patterns, and planarization by CMP (Chemical Mechanical Polishing) is performed until the silicon nitride (6) is exposed, so that a gate interlayer insulating film is completed.

Subsequently, as illustrated in FIG. 3, a resist (21) is applied and developed on the interlayer insulating film (8), so that a hole-shaped resist aperture (21a) to be an etching mask of a contact is formed. Here, as illustrated in the cross-sectional view (b), on the silicon substrate (1) surrounded with the isolation region (2), three resist apertures (21a) (total six in (a)) are arranged between the gate patterns.

As illustrated in FIG. 4, the interlayer insulating film (8) exposed from the resist aperture (21a) is etched through dry etching until the diffusion region (3) is exposed, so that an interlayer insulating film aperture (8a) is formed. Thereafter, the resist (21) is removed from the surface of the interlayer insulating film (8), so that a cell contact hole is formed.

As illustrated in FIG. 5, a conductive film (not illustrated) is formed on the interlayer insulating film (8), and an extra conductive film on the interlayer insulating film (8) is removed through CMP, so that a cell contact (11), in which a conductive film is embedded, is self-aligned.

In the subsequent process of FIG. 6, an interlayer insulating film (13) for formation of a bit contact is formed on the interlayer insulating film (8), and furthermore, a resist (22) is applied and developed thereon, so that a hole-shaped resist aperture (22a) to be an etching mask of a contact is formed. Here, as illustrated in the cross-sectional view (b), on the silicon substrate (1) surrounded by the isolation region (2), one resist aperture (22a) (total two in the word line direction in (a)) is positioned between the gate patterns.

As illustrated in FIG. 7, the interlayer insulating film (13) exposed from the resist aperture (22a) is etched through dry etching until the contact (11) is exposed, so that an interlayer insulating film aperture (13a) is formed. Thereafter, the resist (21) is removed from the surface of the interlayer insulating film (13).

In the process illustrated in FIG. 8, a conductive film (not illustrated) is formed on the interlayer insulating film (13), and an extra conductive film on the interlayer insulating film (13) is removed through CMP, so that a bit contact (15) embedded in the interlayer insulating film aperture (13a) is completed.

Finally, as illustrated in FIG. 9, a conductive film (not illustrated) is formed on the interlayer insulating film (13), and furthermore, a resist (not illustrated) is applied and developed thereon, so that an etching mask (not illustrated) for a bit line is formed. Thereafter, the conductive layer exposed in the resist aperture is etched through dry etching until the interlayer insulating film (13) is exposed, so that a bit line (16) is completed. Subsequently, the resist is removed from the surface of the interlayer insulating film (13).

In the conventional cell contact (11) and bit contact (15), a hole is formed by forming a pattern on a resist through lithography and processing it through dry etching. As such, the dimension of a completed resist pattern and the precision of dry etching significantly affect the shape of a completed contact. This influence will be described with reference to FIG. 10. Meanwhile, (b) and (d) in FIG. 10 are cross-sectional views based on the YY line of (a) and (c) in the same drawing.

After optimum dry etching, the interlayer insulating film aperture (13a) is formed in a predetermined position as illustrated in FIG. 7.

FIGS. 10(a) and (b) show a contact hole pattern in the case where an aperture contact portion (18) is formed due to overlapping of neighboring patterns, which is caused from shortage of isolation margin upon exposing a resist pattern. The shortage of isolation margin becomes significant if with micro-miniaturization, the distance between word lines is reduced, and furthermore, the distance between diffusion layers in the direction of word lines is reduced.

FIGS. 10(*c*) and 10(*d*) show a contact pattern in the case where a non-aperture (19) is partially formed during etching, as a result of local deviation of dry etching.

Although the pattern irregulars illustrated in FIG. 10 have increased with micro-miniaturization of a semiconductor device, it has poor supported by conventional technology using a hole pattern. This problem is not limited to formation of a bit contact. Even in a cell contact formed by a SAC method, although the spacing between word lines can be reduced, the same problem may occur if the distance between diffusion layers in the direction of word lines is reduced.

Japanese Patent Laid-Open No. 2001-223155 discloses a photolithography process, in which a contact aperture is set small. This document discloses a process of exposing mutually crossing line patterns on a negative resist twice and developing a non-exposed portion between the line patterns to be used as a contact aperture mask. In this case, by adjusting the spacing of the line patterns, a desired size of an aperture mask is formed. In this process, shortage of isolation margin upon exposing a resist pattern is resolved. However, like a hole pattern, partial deviation of dry etching cannot be resolved.

Japanese Patent Laid-Open No. 2000-36573 discloses a process of reducing the spacing of contact holes and forming relatively large contact holes in the case where a bit cell contact and a capacitor cell contact are close to each other due to disposition of diffusion layers. According to this process, shortage of isolation margin upon exposing a resist pattern is resolved by forming a thin hard mask layer consisting of polysilicon on an interlayer insulating film forming a contact hole, and forming every other hard mask patterns for apertures of neighboring contact holes through two times of hard mask etching. However, since the hard mask etching is performed twice, the process is complicated. Further, the problem in local deviation of dry etching still exists.

There is an over etching method to resolve local deviation of dry etching. However, since a word line to be a gate electrode is disposed below a bit contact, and an insulating film insulating between the gate electrode and the contact is etched in the portion, in which etching is performed fast due to the over etching, short circuit or other problems may occur. In particular, if a micro-miniaturized cell contact is formed by the SAC method, a contact hole aperture formed thereon is larger than the diameter of the top surface of the cell contact, so that etching of the insulating film covering a word line cannot be avoided. Thus, the over etching has a limit in resolving local deviation.

Meanwhile, Japanese Patent Laid-Open No. 2005-94044 discloses a technique of forming a cell contact by using a line pattern (slit pattern) extending in a longitudinal direction of an active region. This technique pursues additional reduction of a cell contact by additionally forming a side wall after forming a slit pattern. However, since a bit contact formed on the cell contact is manufactured by a conventional method, the problem in forming a bit contact described above is not considered.

As described above, even though conventional technology might have resolved shortage of isolation margin upon exposing a resist pattern, it has complicated processes. In addition, as long as a hole pattern is formed, local deviation of dry etching cannot be resolved. In particular, no technical solution with respect to forming a bit contact has been developed.

SUMMARY

In order to resolve shortage of isolation margin upon exposing a resist pattern and local deviation of dry etching, the inventor of the present invention reviewed a method of forming a cell contact and a bit contact by using a line pattern. In the method using a line pattern (groove pattern), etchants can be moved along with a groove, and thereby resulting in the effect of inhibiting local deviation of dry etching. Further, in case of a line pattern, compared to a hole pattern, isolation margin upon exposing a resist pattern can be easily acquired. However, using a line pattern would be meaningless if it causes manufacturing processes to be complicated. The present invention provides a method of forming a cell contact and a bit contact by effectively using a line pattern without causing complicated processes.

One embodiment of the present invention provides a method of manufacturing a semiconductor device comprising:

forming, on a semiconductor substrate comprising active regions which are element-isolated each other, a word line combining with a gate electrode so as to cross with the active regions;

forming diffusion regions on each active region between the word lines;

forming, on the whole surface, a first insulating film as high as a bit line to be formed;

forming a linear mask pattern having a linear aperture on the extending direction of the active regions on the first insulating film;

etching the first insulating film, while using the linear mask pattern as a mask, so as to form a groove pattern for exposing the surface of the semiconductor substrate comprising the active regions;

embedding a conductive film in the groove pattern;

forming an etching mask pattern passing over a portion, in which a bit contact is formed, on the first insulating film, in which the conductive layer is embedded; and removing the first insulating film and the conductive layer until an upper layer insulating film of the word line is exposed, while using the linear mask pattern as a mask, so as to isolate a bit contact from another contact.

According to the present invention, by using a linear pattern, shortage of isolation margin upon exposing a resist pattern can be resolved. Simultaneously, local deviation of dry etching can be resolved. In addition, by using a linear pattern, a bit contact and a cell contact are integratedly formed. Further, a cell contact, to which a capacitor contact is connected, can be manufactured by reducing the height of the embedded conductive film to the height of the bit contact. As a result, complexity in process and an increase in the number of processes can be inhibited.

BRIEF DESCRIPTION OF THE DRAWINGS

The features and advantages of the present invention that have been described will be more apparent from the following descriptions of certain preferred embodiments taken in conjunction of with the accompanying drawings.

FIGS. 1 to 9 show a method of manufacturing a DRAM in accordance with related art, in which (a) is a plane view, (b) is a cross-sectional view based on the XX line, (c) is a cross-sectional view based on the YY line, and (d) is a perspective projected view.

FIG. 10 shows a technical problem of a manufacturing method of a DRAM in accordance with related art, in which (a) and (b) are a plane view and a cross-sectional view, respectively, in the case where an aperture contact portion (18) is formed due to overlapping of neighboring patterns, and (c)

and (d) are a plane view and a cross-sectional view, respectively, in the case where a non-aperture (19) is partially formed due to etching.

Figures 3A, 3B, 3C, 3D:
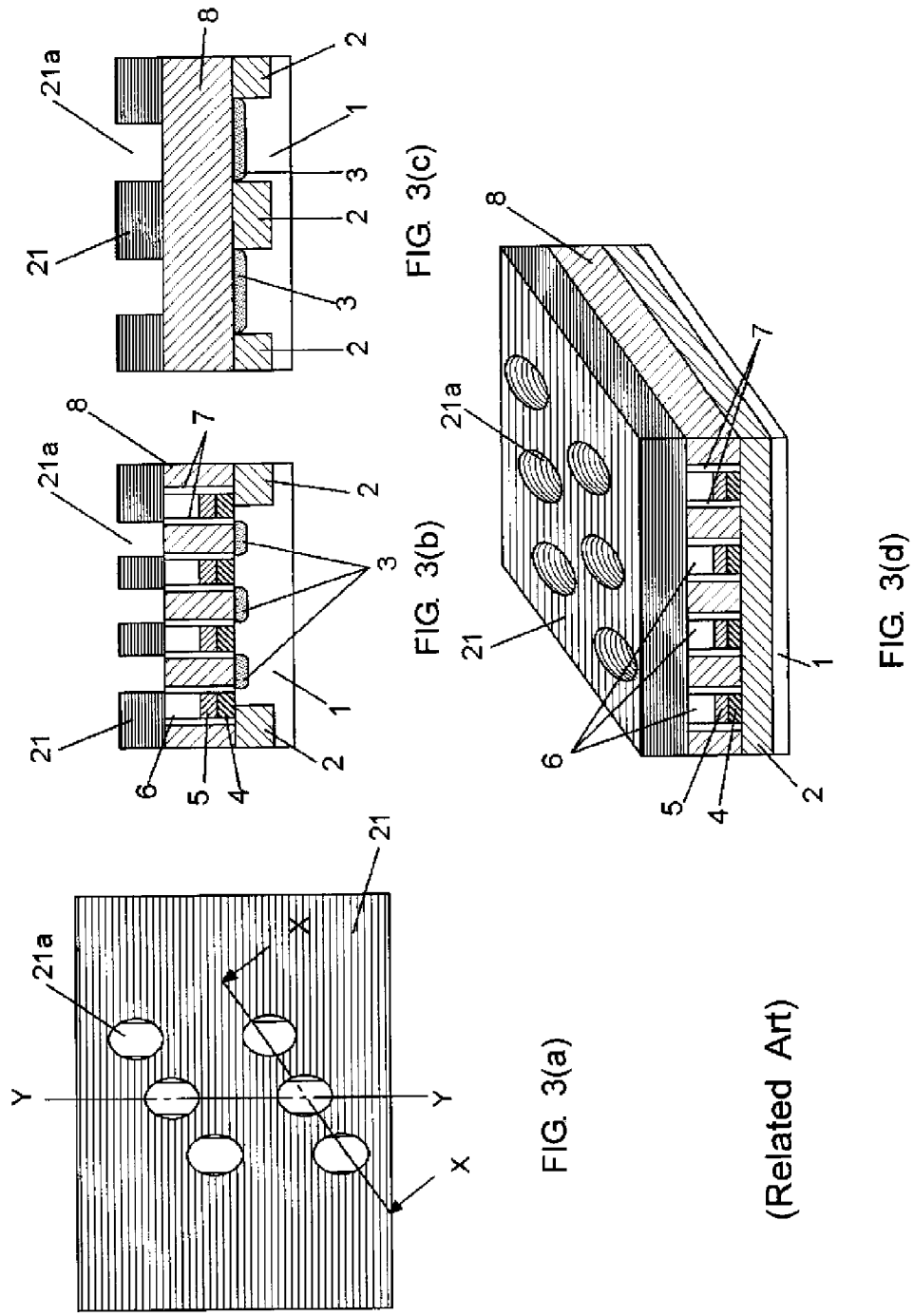
Figure 7A:
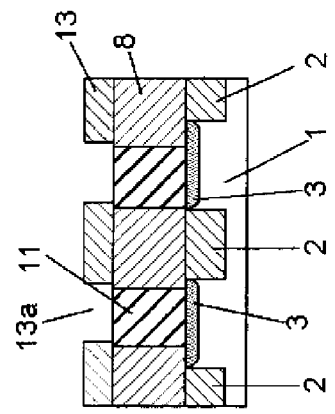
Figure 7B:
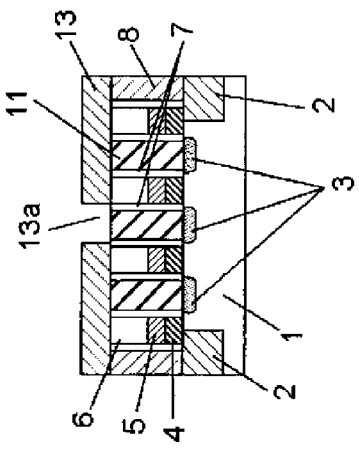
Figure 7C:
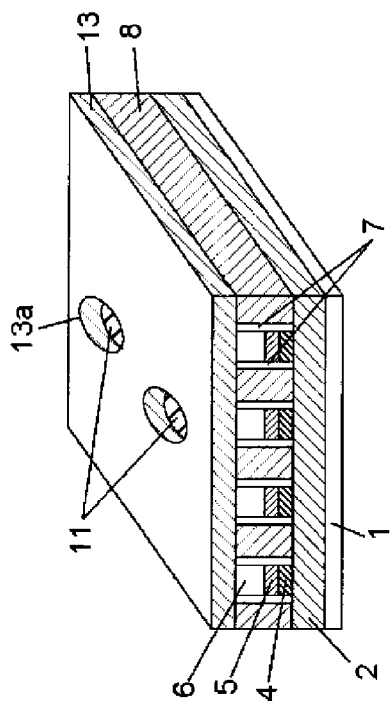
Figure 7D:
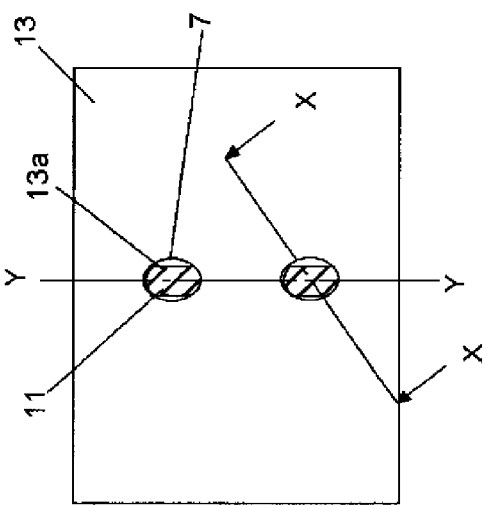
Figure 13C:
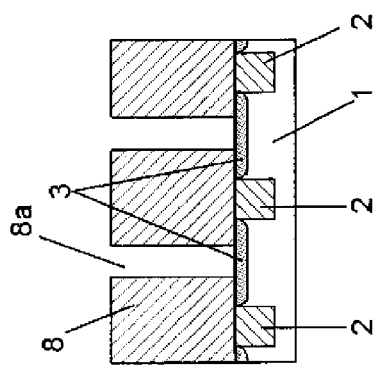
Figure 13B:
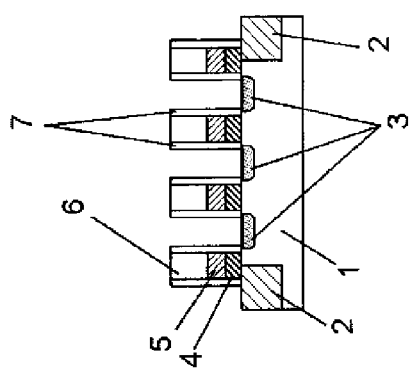
Figure 13D:
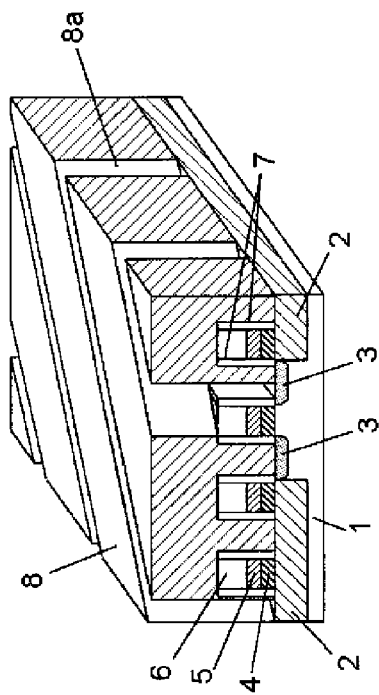
Figure 13A:
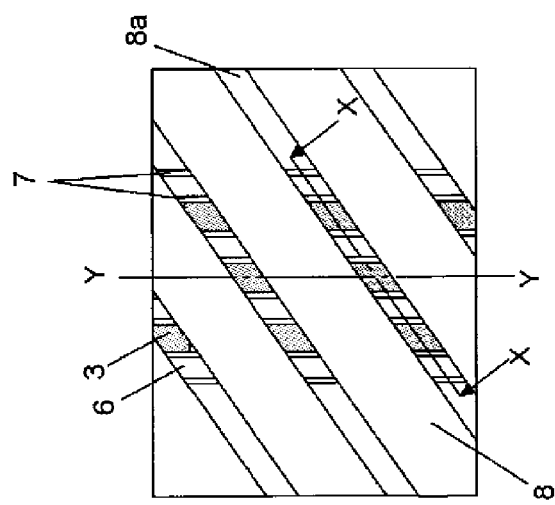
Figure 14C:
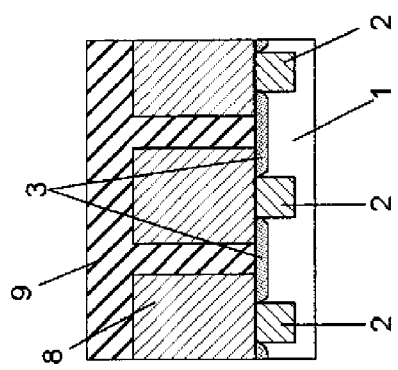
Figure 14B:
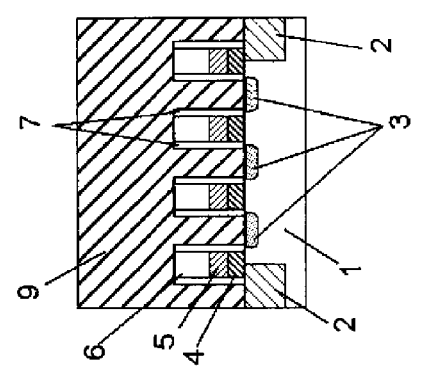
Figure 14D:
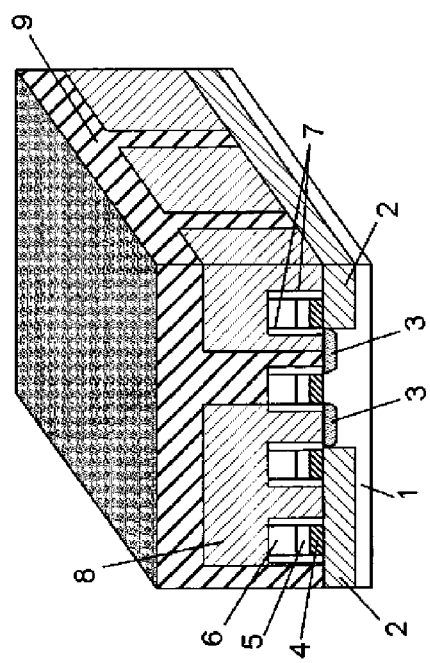
Figure 14A:
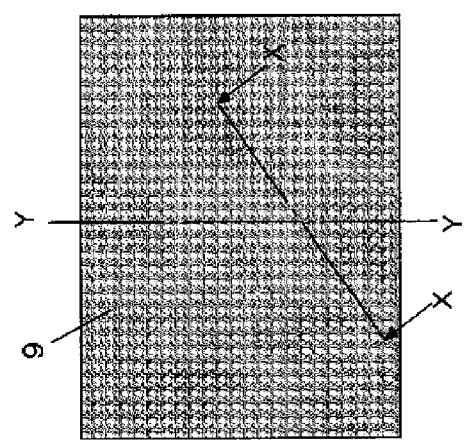
Figure 15C:
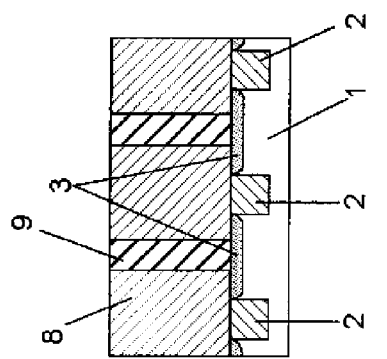
Figure 15B:
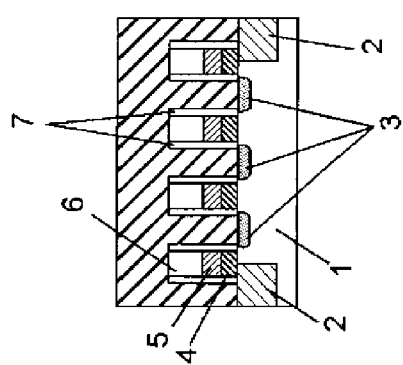
Figure 15D:
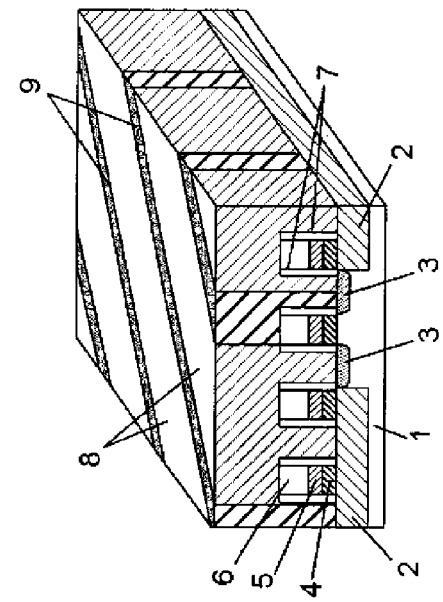
Figure 15A:
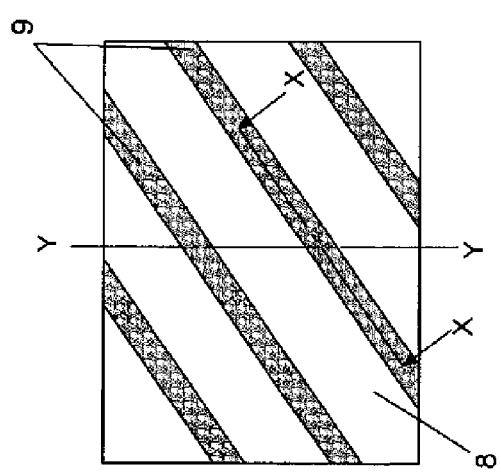

FIGS. 11 to 16 show a method of manufacturing a DRAM in accordance with a first embodiment of the present invention, in which (a) is a plane view, (b) is a cross-sectional view based on the XX line, (c) is a cross-sectional view based on the YY line, and (d) is a perspective projected view.

FIG. 17 is a plane projected view showing an example of a pattern of a laminated film (10) in accordance with another embodiment of the present invention.

FIG. 18 shows a method of manufacturing a contact of a DRAM in accordance with a first embodiment.

Figure 20A:
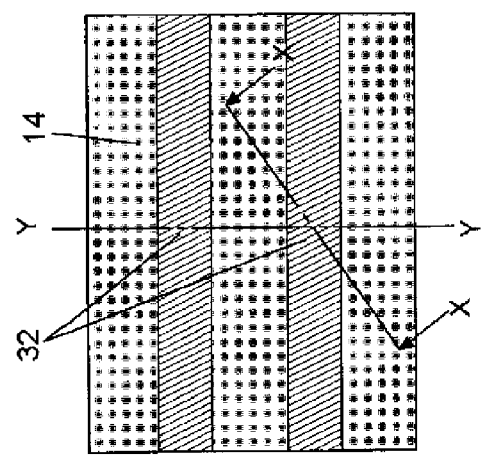
Figure 20B:
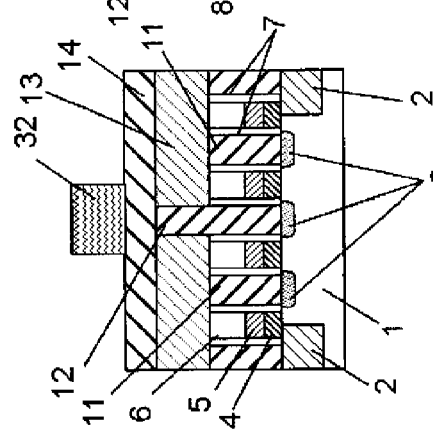
Figure 20C:
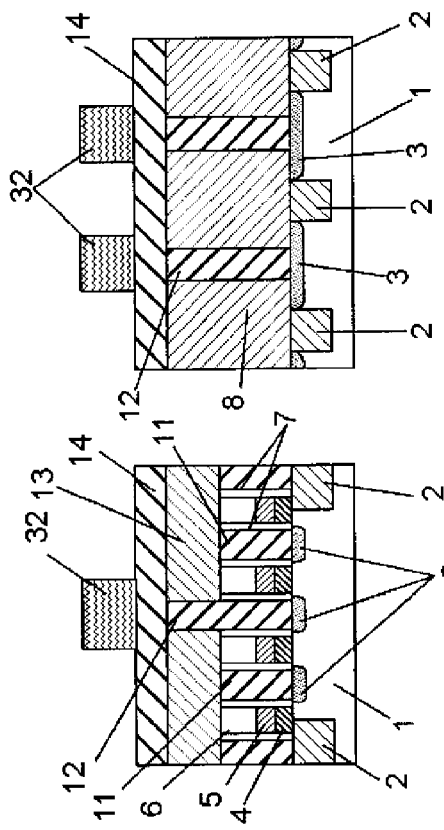
Figure 20D:
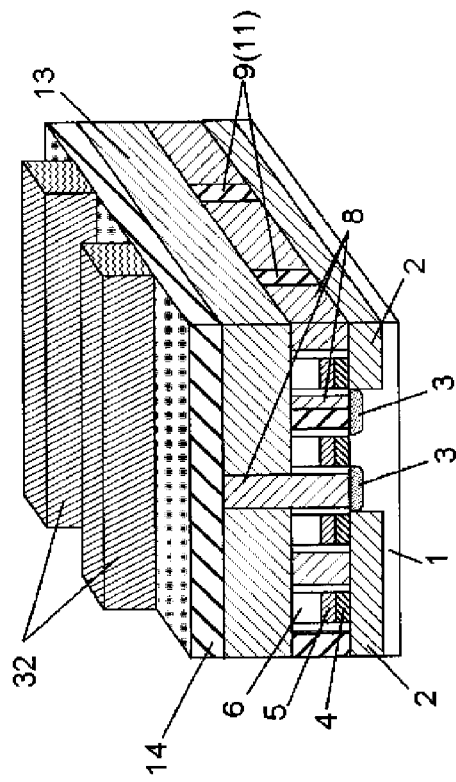

FIGS. 19 to 21 show a method of manufacturing a DRAM line in accordance with a first embodiment.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

FIGS. 11 to 16 and 18 to 21 show processes until formation of a bit line of a cell transistor having the so-called COB (Capacitor Over Bitline) structure, in which a capacitor structure is formed on a bit line, in a semiconductor device of a first embodiment of the present invention. In each of the drawings, (a) is a top view, (b) is an XX cross-sectional view, (c) is an YY cross-sectional view, and (d) is a perspective projected view.

Firstly, as illustrated in FIG. 1, a diffusion region (3) to be a source•drain is formed in a silicon substrate (1) partitioned by an isolation region (2). As to a cell transistor, polysilicon (4), tungsten (5), and silicon nitride (6) are laminated on a gate insulating film (not illustrated) and patterned by lithography and dry etching. Furthermore, after a silicon nitride film is formed and etched back, a side wall (7) is formed on the side surface of the polysilicon (4) and the tungsten (5) so that a gate (word line) is completed (FIG. 11). This embodiment shows the case where the spacing of active regions in the direction of a word line is reduced as shown in conventional technology, compared to FIG. 1.

Subsequently, as illustrated in FIG. 12, an interlayer insulating film (8) is embedded between the gate patterns, and planarization by CMP (Chemical Mechanical Polishing) is performed, so that the silicon nitride (6) is not exposed, to complete a gate interlayer. Here, planarization is finished while leaving the interlayer insulating film (8) on the silicon nitride (6). The thickness of the interlayer insulating film (8) on the silicon nitride (6) is approximately 100 nm, which is equivalent to the thickness of the interlayer insulating film (13) in FIG. 6. In other words, the interlayer insulating film (first insulating film) (8) is left to be as high as the height for forming a bit line.

Subsequently, as illustrated in FIG. 13, a resist (not illustrated) is applied and developed on the interlayer insulating film (8), so that a linear resist aperture (not illustrated) to be an etching mask is formed. Here, the resist aperture is disposed across the gate pattern in the extending direction of the silicon substrate (1) (active region) surrounded with the isolation region (2).

The interlayer insulating film (8) exposed from the resist aperture is etched through dry etching until the diffusion region (3) is exposed, so that an interlayer insulating film aperture (8a) is formed. Thereafter, the resist is removed from the top surface of the interlayer insulating film (8), so that an aperture of a line pattern (groove pattern) is formed.

As illustrated in FIG. 14, a conductive film (9) is formed on the interlayer insulating film (8), and then an extra conductive film on the interlayer insulating film (8) is removed through CMP. As a result, as illustrated in FIG. 15, the conductive film is embedded in a groove pattern. However, this state is incomplete because contacts are connected.

In the subsequent process of FIG. 16, a laminated film (10) is formed by forming an amorphous carbon having a 200 nm thickness, a nitrogen-containing silicon oxide having a 15 nm thickness, and a silicon oxide having a 15 nm thickness in this order on the interlayer insulating film (8). A resist (31) is applied and developed thereon, so that a linear resist (31) to be an etching mask of the laminated film (10) is formed. Additionally, even though the linear laminated film (10) is formed by dry etching, the resist (31) remains. Here, as illustrated in the plane view (a), the resist (31) and the laminated film (10) are disposed in the position across the linear conductive film (9). This embodiment shows the case where a bit contact diffusion layer is disposed between neighboring word lines in the direction of the word lines. The resist (31) and the laminated film (10) are disposed between neighboring word lines. For example, as illustrated in FIG. 17(a), in the case where an active region (3a), in which a diffusion layer (3) is formed, is arranged zigzag in a half cycle, it may be disposed across both the linear conductive film (9) and the word lines. In addition, the disposition of the resist (31) and the laminated film (10) is not limited to the straight-line disposition, and may be flexural line disposition as illustrated in FIG. 17(b). Moreover, a dot-type pattern may be formed only around on the conductive film (9) of the bit contact portion. In sum, the laminated film (10) to be a hard mask is preferably disposed to remain on the conductive film (9) of the bit contact portion. More preferably, part of the interlayer insulating film (8) remains around the conductive film (9), which needs to remain for a bit contact, so that collapse of the conductive film can be prevented.

As illustrated in FIG. 18, digging down is performed through dry etching until the silicon nitride (6) is exposed, while leaving the portion covered by the laminated film (10), so that the contact (11) to be a cell contact and the contact (12) to be a bit-cell integrated contact are isolated. As to the dry etching, the tungsten conductive film (9) and the silicon oxide interlayer insulating layer (8) are simultaneously etched, which is a signature point in the manufacturing method of this embodiment. The dry etching condition is as described below. Here, since the etching selectivity ratio of tungsten and silicon oxide is the same, processing can be performed without causing an etching step difference.

Dry Etching Condition (Simultaneous Etching)
(1) Method: reactive ion etching (RIE)
(2) Source power: 400 W
(3) Bias power: 50 W
(4) Pressure: about 0.53 Pa (4 mTorr)
(5) Wafer temperature: 15° C.
(6) Process gases and flow rate: $CF_4/Cl_2/O_2/N_2=55/20/10/100$ sccm
(7) Selectivity Ratio: SiN/W/SiO=1.3/1.0/1.0

The conductive film (9) and the interlayer insulating film (8) do not need to be simultaneously etched and may be individually etched. In this case, the dry etching condition is as described below. Under the etching condition for the conductive film (9), etching of the interlayer insulating film (8) is impossible. Likewise, under the etching condition for the interlayer insulating film (8), etching of the conductive film (9) is impossible. Thus, by adjusting the finish point of etchings, processing can be performed without causing an etching step difference. However, if the interlayer insulating film (8) is first etched and removed, the remaining conductive film (9) may fall down and be damaged. Thus, first performing etching of the conductive film (9) is preferable.

Dry Etching Condition (Etching of Conductive Film (9))
(1) Method: RIE
(2) Source power: 1000 W
(3) Pressure: about 0.67 Pa (5mTorr)
(4) Wafer temperature: 20° C.
(5) Process gas and flow rate: $SF_6/Ar=150/10$ sccm Dry Etching Condition (Etching of Interlayer Insulating Film (8))
(1) Method: RIE
(2) Source power: 2000 W
(3) Pressure: about 10.7 Pa (80 mTorr)
(4) Wafer temperature: 60° C.
(5) Process gas and flow rate: Perfluorocyclobutane $(C_4F_8)/Ar/O_2=15/750/15$ sccm During dry etching, the resist (31) and the nitrogen-containing silicon oxide and the silicon oxide in the laminated film (10) are removed. The amorphous carbon remaining after etching can be removed by ashing through oxygen plasma. In the process illustrated in FIG. 19, the interlayer insulating film (13) is formed to embed the contact (11) and the contact (12), and planarization is performed by CMP until the contact (12) is exposed, so that a contact interlayer is completed.

As illustrated in FIG. 20, the conductive film (14) is formed on the interlayer insulating film (13), and a resist (32) is applied and developed thereon, so that a linear resist pattern (32) to be an etching mask of a line is formed. Here, the linear resist pattern (32) is disposed on the contact (12) exposed in FIG. 19. However, for simplification, FIG. 20 disposes the linear resist pattern (32) in a direction orthogonal to the word line. In an actual semiconductor device, the linear resist pattern (32) is disposed in a position other than a position, in which a capacitor contact (not illustrated) being connected to the contact (11) is formed.

The conductive film (14) is etched through dry etching until the interlayer insulating film (13) is exposed, while using the linear resist pattern (32) as an etching mask, so that a bit line (16) is completed. Thereafter, the resist (32) is removed, so that the structure illustrated in FIG. 21 can be obtained.

Subsequently, the bit line (16) is embedded by an interlayer insulating film, and planarization is preformed. Thereafter, a process of forming a capacitor starts. The structure of a capacitor is not limited, and includes a known capacitor structure such as a stack type, a crown type, and a cylindrical type.

As described above, the contact of the present invention is formed by forming a linear pattern and then removing a conductive layer through CMP or dry etching to reach to a portion defined as a base film. Thus, a hole pattern of a resist is unnecessary so that contacting of neighboring patterns does not occur. Further, since local deviation of etching resulting from a hole pattern can be reduced, the technical problem of conventional technology can be resolved.

The structure, in which two neighboring transistors share a bit contact diffusion layer, and both sides thereof have a capacitor contact layer to form one cell, has been described as an example. However, the present invention is also applicable to the case where one transistor forms one cell.

As to the gate structure of a transistor, a planar structure of a polymetal structure, in which tungsten is laminated on polysilicon, has been described. However, a polycide structure, in which silicide is formed, or a recess gate structure, in which a gate is embedded in a substrate, is applicable. The other materials that have been described are not limited to the exemplified materials.

Moreover, as disclosed in Japanese Patent Laid-open No. 2005-94044, a side wall may be formed after a line pattern is formed in order to achieve micro-miniaturization of a line pattern in a side direction.

The present invention has been described with reference to embodiments. However, the present invention is not limited to the embodiments and may be modified within the scope of the essence of the present invention.

What is claimed is:

1. A semiconductor device comprising on a substrate:
   at least three line patterns A arranged in parallel each other; and
   line patterns B disposed in gaps of the at least three line patterns A;
   wherein the line patterns B comprise a first insulating film and a conductive film dividing the first insulating film in a direction extending the line pattern B, and
   wherein the line patterns B comprise a line pattern B1 whose top is located at the same level of the top of the line patterns A and a line pattern B2 whose top is located at the higher level than the top of the line patterns A.

2. The semiconductor device according to claim 1, further comprising a second insulating film on the line patterns A and the line pattern B1, the second insulating film being in contact with the both sides of the line pattern B2 over the line pattern A, and the top of the second insulating film being located at the same level of the top of the line pattern B2.

3. The semiconductor device according to claim 1, wherein the conductive layers in the line patterns B are located along with a line extending to a direction not parallel to the line patterns A and B.

4. The semiconductor device according to claim 1, wherein each of the line patterns B comprises a plurality of the conductive layers that are evenly separated each other by the first insulating film.

5. The semiconductor device according to claim 1, wherein the conductive film in the line pattern B1 constitutes a contact plug P1 through the first insulating film and the conductive film in the line pattern B2 constitutes a contact plug P2 through the first insulating film.

6. The semiconductor device according to claim 5, wherein the contact plugs P1 and P2 have a planar shape of a parallelogram in which a pair of opposed sides is parallel to the line patterns A.

7. The semiconductor device according to claim 5, wherein the line pattern A comprises a conductive layer, an insulating layer on the conductive layer and sidewalls disposed on the sides of a stack of the conductive layer and the insulating layer.

8. The semiconductor device according to claim 5, wherein the contact plugs P1 and P2 are electrically connected to a diffusion layer disposed on a semiconductor substrate as the substrate.

9. The semiconductor device according to claim 8, wherein the semiconductor substrate comprises an active region that is extended in a direction not parallel to the line patterns A, two of the line patterns A pass over the active region, three diffusion layers are provided on the active region where no line pattern A passes, the contact plug P2 is electrically connected to one diffusion layer provided between the two line patterns A and the contact plug P1 is electrically connected to each of two remained diffusion layers.

10. The semiconductor device according to claim 9, further comprising a wiring electrically connected to the top of the contact plug P2.

* * * * *